(12) United States Patent
Henrickson et al.

(10) Patent No.: US 6,246,093 B1
(45) Date of Patent: Jun. 12, 2001

(54) HYBRID SURFACE/BURIED-CHANNEL MOSFET

(75) Inventors: Lindor E. Henrickson; Sheldon Aronowitz, both of San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 423 days.

(21) Appl. No.: 08/719,773

(22) Filed: Sep. 25, 1996

(51) Int. Cl.$^7$ .................................................. H01L 29/78
(52) U.S. Cl. ............................................................ 257/345
(58) Field of Search ............................................... 257/345

(56) References Cited

U.S. PATENT DOCUMENTS

| | | |
|---|---|---|
| 4,841,346 | 6/1989 | Noguchi . |
| 4,859,620 | 8/1989 | Wei et al. . |
| 4,901,129 | 2/1990 | Hynecek . |
| 5,500,379 | 3/1996 | Odake et al. . |

FOREIGN PATENT DOCUMENTS 61-256769 * 11/1986 (JP) .
62-241378 * 10/1987 (JP) .

OTHER PUBLICATIONS

Wolf, "Silicon Processing for the VLSI Era, vol. 2: Process Integration", Lattice Press, Sunset Beach, CA, pp. 309–311 (1990).

Wolf, "Silicon Processing for the VLSI Era, vol. 3: The Submicron Mosfet", Lattice Press, Sunset Beach, CA, pp. 232–241 and 308–313 (1995).

* cited by examiner

Primary Examiner—Stephen D. Meier

(57) ABSTRACT

A MOSFET having a buried channel structure and an adjacent surface channel structure between a source region and a drain region. The surface channel structure is preferably formed adjacent the source region via angular implantation techniques. By combining the advantages of the surface channel device with the buried channel device, the resulting hybrid MOSFET structure has improved drive current and switching characteristics.

14 Claims, 4 Drawing Sheets

HYBRID SURFACE/BURIED-CHANNEL MOSFET

BACKGROUND OF THE INVENTION

This invention relates generally to MOSFET devices and more particularly to a hybrid buried-channel MOSFET device capable of increased drive current without changing the drawn gate length.

Metal-oxide semiconductor field effect transistors or "MOSFETs" are widely used in modern integrated circuit construction. A MOSFET, in general, comprises a semiconductor substrate, a source electrode and a drain electrode formed therein which have a conductivity opposite to that of the substrate, a gate electrode, and a gate insulation layer such as an oxide layer formed between the substrate and the gate electrode. Hereinafter such a structure is referred to as a "typical surface channel structure" whereby conduction of carriers primarily occurs at or immediately adjacent the surface of the substrate.

Another FET structure provides a buried channel layer formed between the source and the drain electrodes having an opposite conductivity to that of the substrate. Hereinafter this structure is referred to as a "buried channel structure" whereby conduction of carriers primarily occurs within the substrate. Construction of such structures is well known in the art and is not further described here.

A common material used for a gate electrode of a conventional MOSFET is polysilicon. Usually, phosphorus or boron is diffused or implanted, at a high density, into the polysilicon so as to form a gate electrode made of N+ polysilicon or P+ polysilicon in order to lower the resistance of the gate electrode and make stable the work function thereof. Metals having a high melting point such as tungsten, molybdenum or silicides thereof are also well known materials for use as gate electrodes.

The creation of a surface channel MOSFET is well known in the art and is only generally described here. In an N-channel device, the polysilicon gate is N+ doped. Application of a threshold voltage to the gate, which is typically on the order of 0.8 volts, causes the substrate region directly below the gate to undergo inversion whereby the MOSFET adopts a typical surface channel structure. Thereafter, application of a potential between the source and drain acts to drive current between source and drain through this surface channel region. Formation of a surface channel in a P-channel device having a P+ doped gate is accomplished by applying a negative threshold voltage to the gate. Surface channel MOSFETs have a distinct advantage in that they form efficient switches with very little leakage current when subthreshold voltages are applied to the gate.

When a gate potential is applied to surface channel structures, carriers are drawn to the surface of the substrate. Carrier mobility is reduced due to scattering at the surface as the electric field increases. As a result, the operation speed and drive capability of the device are reduced. Further, many hot carriers can be produced in the surface region of the substrate and these hot carriers can be trapped in the interface between the substrate and the gate insulative layer. The trapped carriers cause a change in electrical characteristics of the device thus decreasing its reliability.

A buried channel FET is less subject to the above-described detrimental effects. Buried channel structures can be formed by applying a positive threshold voltage to a polysilicon gate in an N-channel device or a negative threshold voltage to a polysilicon gate in a P-channel device. The buried channel exhibits less surface scattering than the surface channel. The resulting higher carrier mobility leads to reduced resistance and increased conductivity in the device. However, buried channel structures are more sensitive to short channel effects which reduce their effectiveness as switches. These effects include increased leakage current when the MOSFET is "off" and the onset of punchthrough at smaller drain biases as the channel length decreases.

One method for minimizing this short channel effect is disclosed in U.S. Pat. No. 4,841,346 to Noguchi which prescribes selecting a gate electrode material whose Fermi level is located between a conduction band and a valence band of the semiconductor. Another way to increase the drive current of a buried-channel MOSFET is to decrease the gate length of the device. However, these approaches are not always desirable for the reasons described above. Nor are they always feasible due to lithography limitations.

Accordingly, a need remains for a method for manufacturing a MOSFET having improved current flow and efficient switching characteristics.

SUMMARY OF THE INVENTION

It is, therefore, an object of the invention to provide a novel MOSFET which has a high operation speed, a high carrier mobility, a high current drive capability, and a high reliability.

The invention is a hybrid MOSFET device structure in which part of the channel is a "buried channel" and the remainder of the channel is a conventional surface channel. This structure enables the device to take advantage of the benefits of both technologies: the low series resistance of the buried channel, and the good transistor characteristic of the surface channel. By making the surface channel region relatively short, one can achieve both good transistor switching and leakage characteristics and a higher drive current capability. The hybrid design may be applied to both NMOS and PMOS devices, but can be most useful to increase the drive capability of the PMOS devices in a CMOS process.

A hybrid MOSFET device constructed according to the invention comprises a semiconductor substrate of a first conductivity type and a source and drain region of a second conductivity type formed on the substrate and separated by a channel length. A buried channel region of the second conductivity type is positioned between the source region and drain region. Furthermore, a surface channel region of the first conductivity type is formed between the source region and the drain region in series with the buried channel region, preferably between the buried channel region and the source region.

The method for fabricating the above semiconductor device comprises the steps of forming a transistor structure having a gate electrode, source and drain regions and a gate oxide on a semiconductor substrate. The source and drain regions are laterally separated within the substrate by a channel length. A buried channel region is formed between the source and drain region. Finally, after forming the buried channel region, a surface channel region is formed at a selected location between the source and drain regions and adjacent the buried channel region. The surface channel has a length which is preferably between 20% to 50% of the overall channel length.

The foregoing and other objects, features and advantages of the invention will become more readily apparent from the following detailed description of a preferred embodiment of the invention which proceeds with reference to the accompanying drawings.

DETAILED DESCRIPTION

Figure 1:
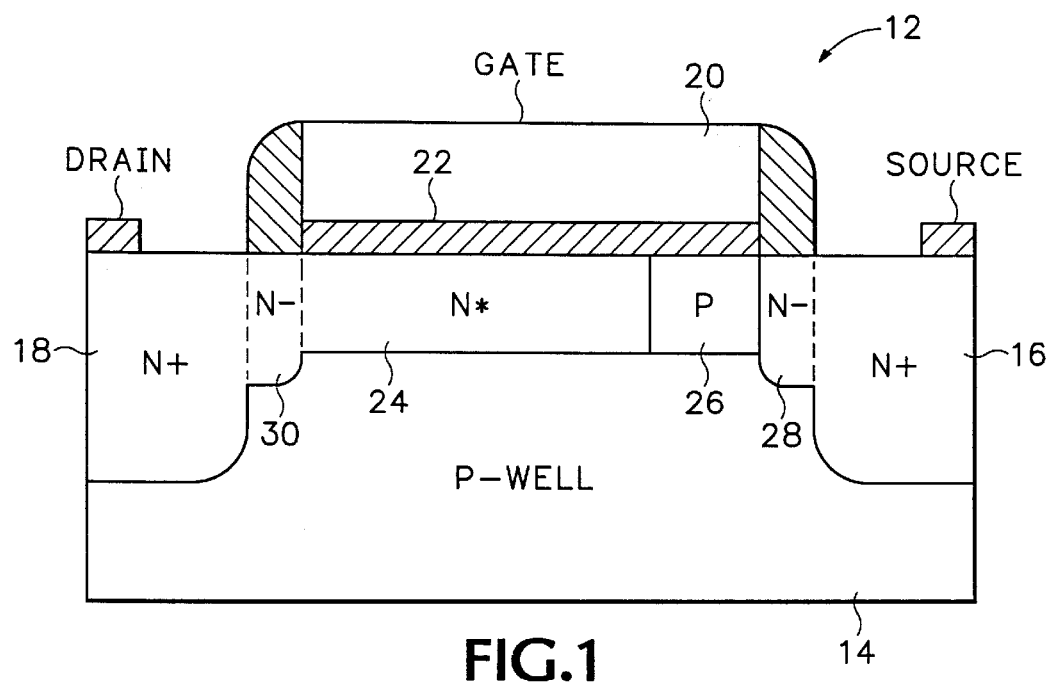
FIG. 1 is a cross sectional view of an NMOSFET device constructed according to the present invention.
Figure 2:
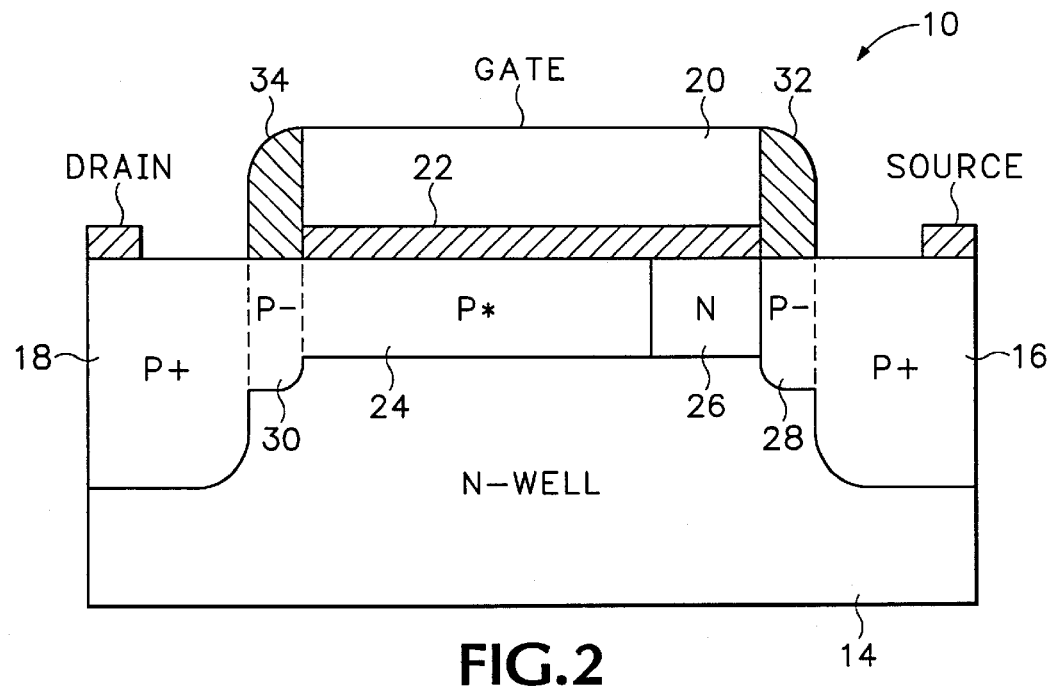
FIG. 2 is a cross sectional view of a PMOSFET device constructed according to the present invention.

A cross-sectional structure for both NMOS and PMOS hybrid surface/buried channel devices is depicted schematically in FIGS. 1 and 2 at 12 and 10 respectively. Devices 10,12 comprise a substrate 14 of a first conductivity type. The NMOS device 12 includes a substrate which is P-doped, meaning that the primary carriers of the substrate are "positive" holes. In the PMOS device 10, the first conductivity type is "negative" due to the N-doped substrate having electrons as the primary carriers. Devices 10,12 further comprise a source region 16 and a drain region 18 of a second conductivity type formed in substrate 14. The second conductivity type is understood in the art to be opposite that of the first conductivity type. In the NMOS device 12 of FIG. 1, source and drain regions 16,18 are N+ doped to contain electrons as the primary carriers. In the PMOS device 10 of FIG. 2, source and drain regions 16,18 are P+ doped to contain holes as the primary carriers.

The MOSFET devices shown in FIGS. 1 and 2 include a gate electrode 20 and an insulator 22 such as an oxide which separates the gate electrode from the substrate. The region within the substrate and under the gate electrode 20 between the source and drain regions 16,18 is known generally as the "channel region" which separates the source and drain regions by a channel length. The channel region includes a buried channel 24 of the second conductivity type (P* in device 10; N* in device 12) and a surface channel 26 of the first conductivity type. The two channel regions are formed between the source and drain regions 16,18 by the processes discussed in further detail below.

The preferred structure also includes lightly doped drain regions 28,30 of the second conductivity type adjacent respective source and drain regions 16,18. Regions 28,30 can be formed by conventional means, as by implantation prior to deposition of gate spacers 32,34 formed on lateral sides of the gate electrode 20.

The following general design guidelines apply for the PMOS (NMOS) device shown generally at 10 and 12 respectively. First, the doping of the P* (N*) buried-channel region 24 must be chosen high enough such that the series resistance of this region is relatively low; however, the doping must be low enough such that the N (P) surface-channel region 26 is not punched through. The preferred doping density of P* (N*) buried channel region 24 is on the order of $10^{16}$ to $10^{18}$ $cm^{-3}$ which is typically lower than the doping density of the source and drain regions 16,18. Second, the N (P) surface-channel region should be narrow compared to the overall gate length to improve the drive current. Preferably, the surface channel region has a length which is between about 20% and 50% of the overall channel length between the source and drain regions but it is most preferred that the surface channel length be as small as feasible. Third, doping concentration of the N (P) surface-channel region 26 should be chosen such that primary control of the transistor characteristic is due to the surface channel region. The preferred doping density of surface-channel region 26 is on the order of about $10^{16}$ to $10^{18}$ $cm^{-3}$. Fourth, for an asymmetrical structure as shown in FIGS. 1 and 2, the N (P) surface-channel region 26 should preferably appear on the source side 16 of the device to avoid severe punchthrough from the drain; i.e., this allows the buried-channel region 24 to mitigate punchthrough and leakage effects arising from the drain.

The hybrid surface/buried-channel structure can be fabricated in a straightforward manner using conventional semiconductor processing techniques. To demonstrate the characteristics of the described hybrid device, we have used a combination of process and device simulations to investigate a 0.4 µm PMOS device. The device structure of the hybrid device, as obtained from the 2-D process simulation, is shown in FIG. 3.

Figure 4:
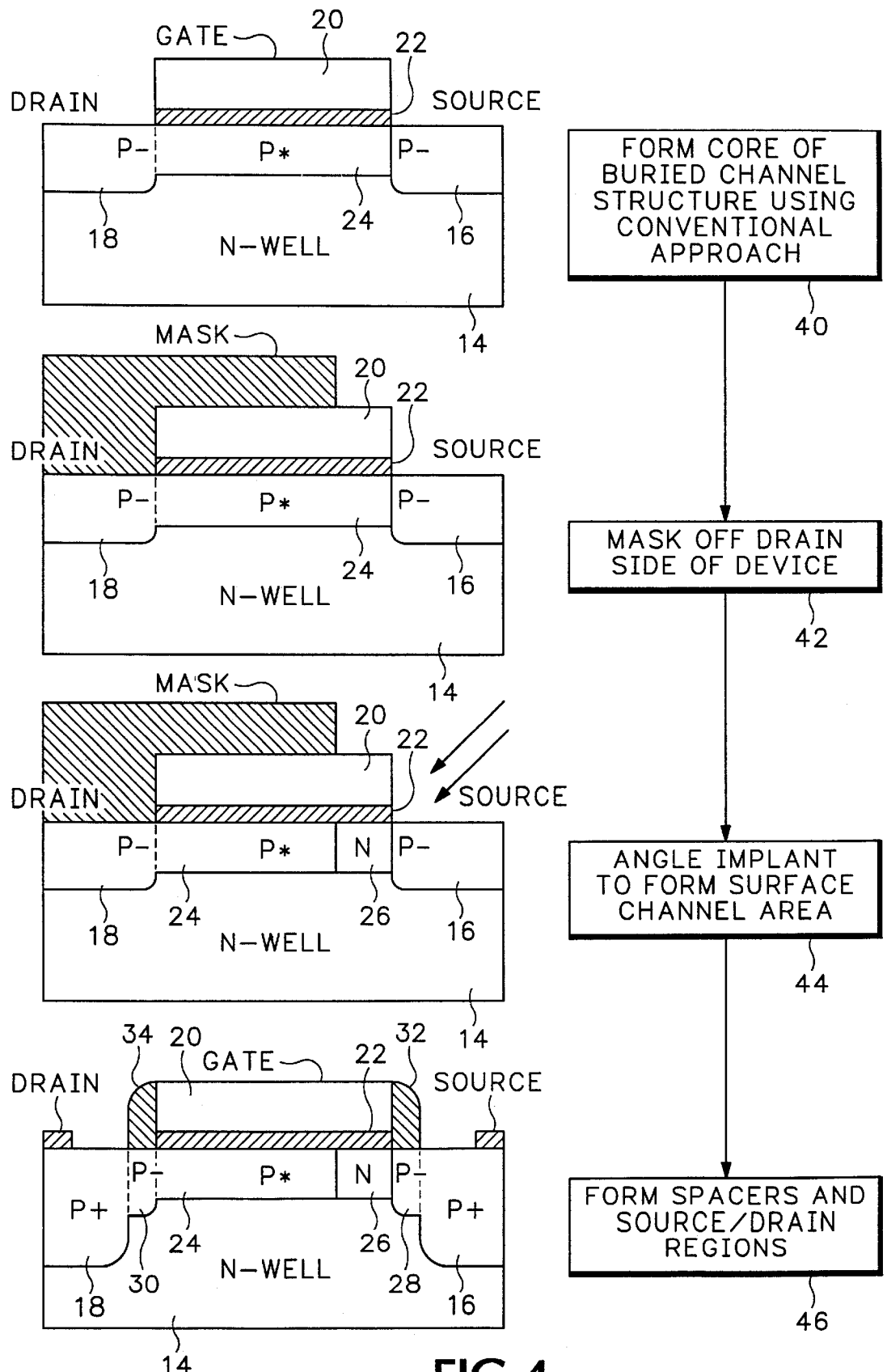
FIG. 4 shows in block diagram and parallel flow chart form the preferred process used to form the device of FIG. 2 according to the invention.

The process for forming the hybrid device described above is shown in FIG. 4. The PMOS device 10 is produced by first making a simple buried channel device in step 40; however, the P* doping concentration of buried-channel implant 24 is increased significantly over that of a conventional buried-channel device. After forming the buried channel structure, the surface channel is formed beneath the gate electrode 20 and between the buried channel region 24 and source region 16 by masking off the drain side 18 in step 42 and performing a high-angle N-type implant adjacent an edge of the gate electrode 20 in step 44. Using current lithographic technology, the high-angle implantation step is capable of defining features as small as 0.15 µm where alignment of the feature is relatively unimportant. Thereafter, the spacers 32,34 are formed on the gate and the source and drain regions 16,18 are doped in step 46, thereby leaving LDD regions 28,30 adjacent the surface and buried channel regions 26,24. The LDD concentration is preferably greater than the buried channel concentration (i.e. on the order of $10^{18}$ to $10^{19}$ $cm^{-3}$). This prevents the N-type angle implant from inverting the LDD region prior to formation of the surface channel region 26.

Figure 3:
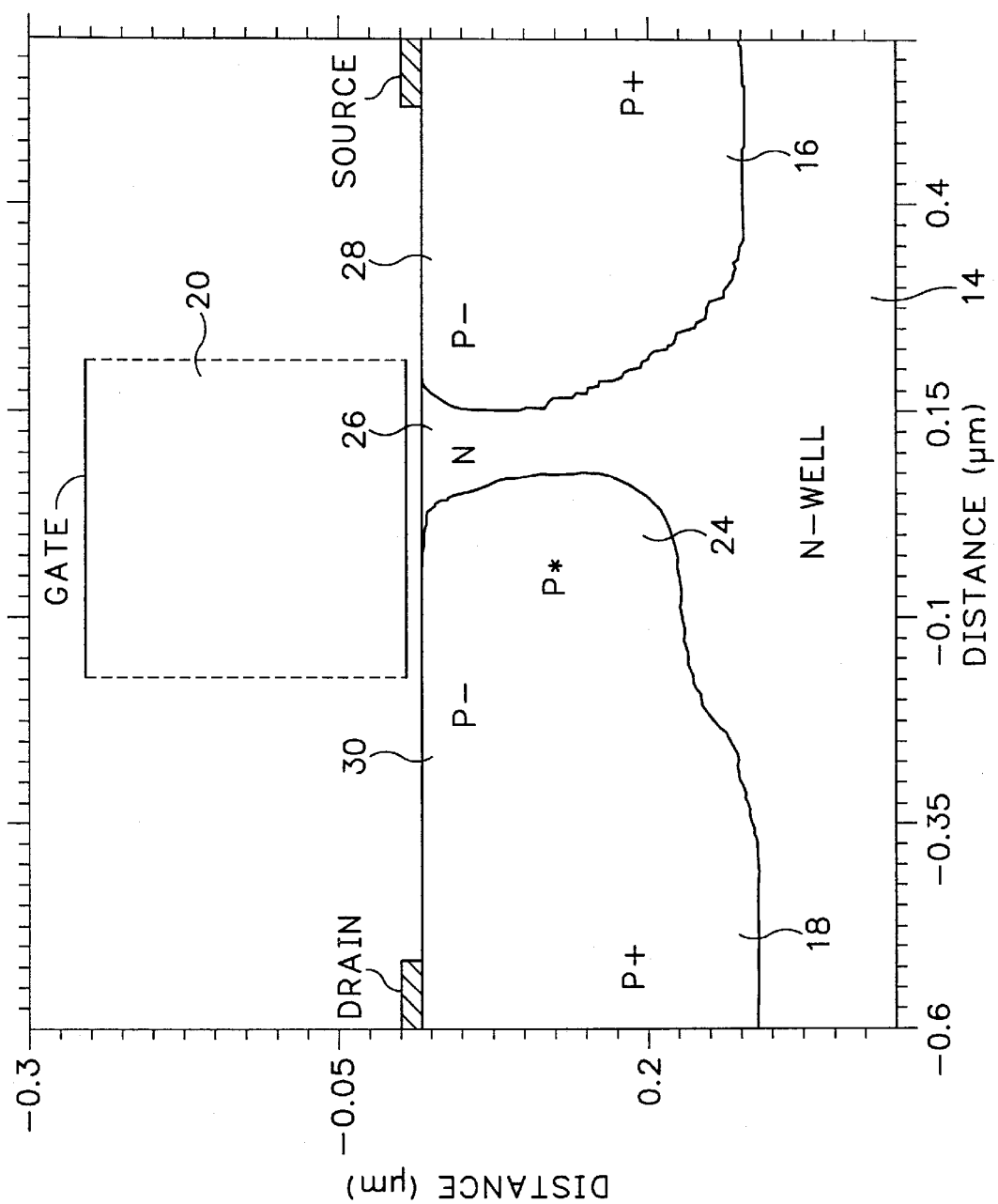
FIG. 3 shows a 0.4 µm PMOSFET constructed according to the present invention as generated by two-dimensional process simulation.
Figure 5:
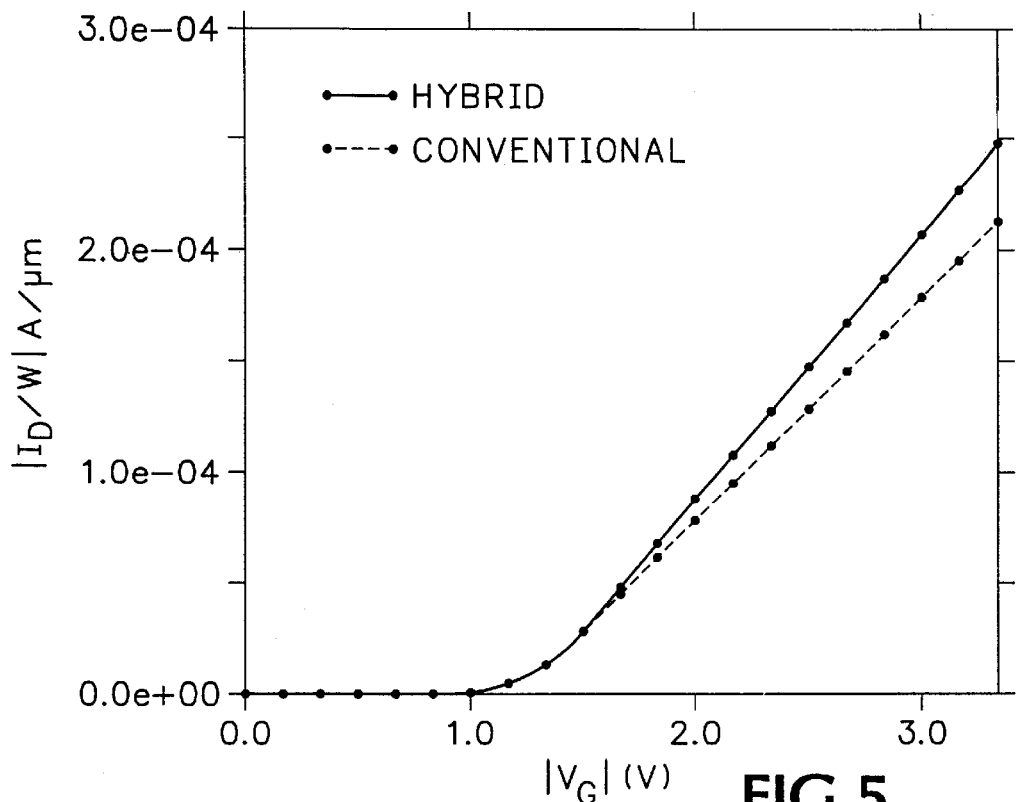
FIG. 5 is a graph showing current-voltage characteristics for the device of FIG. 3 compared to conventional buried channel devices at a drain voltage of −3.3 volts.
Figure 6:
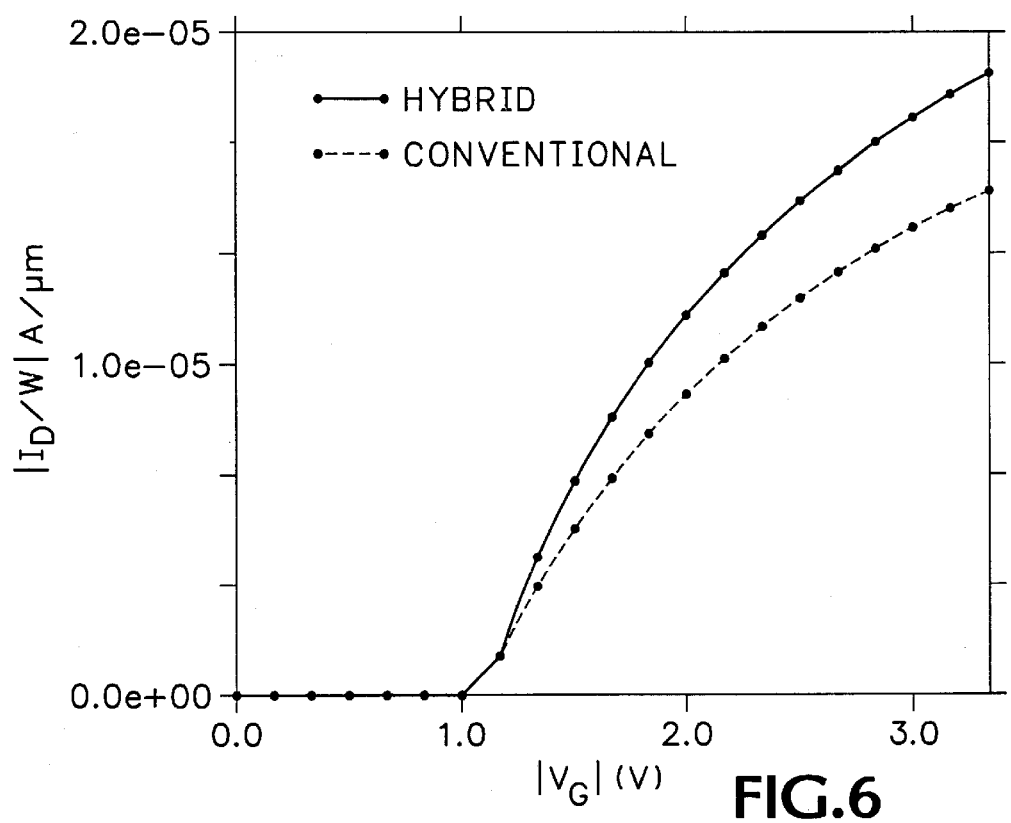
FIG. 6 is a graph showing current-voltage characteristics for the device of FIG. 3 compared to conventional buried channel devices at a drain voltage of −0.1 volts

Simulated I–V curves for the hybrid structure are shown in FIGS. 5 and 6 for the device of FIG. 3. For comparison, the I–V curves of a conventional buried channel device having the same drawn gate length and threshold voltage are also displayed. From the simulated results of FIGS. 5 and 6, it is apparent that the hybrid device exhibits both a very good transistor characteristic and a higher drive current than a comparably sized buried-channel device; in this particular case, the increase in drive current at $V_D$=−3.3 is about 15%. The simulated threshold voltages (at $V_D$=−3.3) and drive currents at a bias condition of $V_G$=−3.3, $V_D$=−3.3, $V_S$=$V_B$=0 are shown in Table 1 below. Table 1 shows a comparison of threshold voltage ($V_T$) and drive current ($I_D$) at $V_D$=−3.3V for 0.4 µm hybrid surface/buried-channel and conventional channel PMOS devices.

TABLE 1

|  | Hybrid | Conventional |
| --- | --- | --- |
| $V_T(V)$ | −0.922 | −0.922 |
| $I_D(A/\mu m)$ | $2.50 \times 10^{-4}$ | $2.17 \times 10^{-4}$ |

As a final note, it is understood that a variant of this hybrid device could be fabricated. For example, one could construct a symmetrical version which has surface channel devices at both ends of the gate, and a buried channel under the center of the gate. However, it is expected that an asymmetrical structure would have a higher drive current capability. The asymmetrical structure would also have the advantage of exhibiting a "signature" when compared to conventional buried or surface channel devices. Conventional devices are constructed in a symmetrical manner, and thus their I–V characteristics are symmetrical with respect to the source-drain bias; that is, if we reverse the source and drain, we get the same device I–V characteristics.

The proposed asymmetrical hybrid device would exhibit an asymmetry in the I–V characteristic if the source and drain were reversed. For example, the current-voltage characteristics of the asymmetrical hybrid device is measured by first measuring current flow through the device for a range of bias voltages applied across the source and drain regions. One then exchanges the source and drain biasing and then measures the new current magnitudes for the same range of bias voltages.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A semi-conductor device comprising:
   a semiconductor substrate of a first conductivity type;
   a source region and a drain region of a second conductivity type formed in the substrate and separated by a channel length;
   a buried channel region of the second conductivity type formed between the source region and the drain region; and
   a surface channel region of the first conductivity type formed between the source region and the drain region, said surface channel region having a surface channel length less than the channel length between said source and drain regions.

2. The semi-conductor device of claim 1 wherein the surface channel region is formed between the buried channel and the source region.

3. The semi-conductor of claim 2, further including a second surface channel region, wherein said second surface channel region is disposed between the buried channel and the drain region.

4. The semi-conductor of claim 2, further including:
   a lightly doped drain (LDD) region of the second conductivity type adjacent the drain region and the buried channel.

5. The semi-conductor of claim 1 wherein the buried channel region has a doping density of the second conductivity type which is lower than a doping density of the source and drain regions.

6. The semi-conductor of claim 5 wherein the buried channel region has a doping density of between about $10^{16}$ to $10^{18}$ $cm^{-3}$.

7. The semi-conductor of claim 1 wherein the surface channel region has a length which is between about 20% and 50% of the channel length between the source and drain regions.

8. A semi-conductor device comprising:
   a semiconductor substrate of a first conductivity type;
   a gate electrode disposed on said substrate;
   a source region and a drain region of a second conductivity type formed in the substrate aligned with said gate electrode and separated by a channel length;
   a buried channel region of the second conductivity type formed between the source region and the drain region; and
   a surface channel region of the first conductivity type formed between the source region and the drain region.

9. The semi-conductor device of claim 8 wherein the surface channel region is formed between the buried channel and the source region.

10. The semi-conductor of claim 9, further including a second surface channel region, wherein said second surface channel region is disposed between the buried channel and the drain region.

11. The semi-conductor of claim 9, wherein the drain region further includes a lightly doped drain (LDD) region of the second conductivity type adjacent the buried channel.

12. The semi-conductor of claim 8 wherein the buried channel region has a doping density of the second conductivity type which is lower than a doping density of the source and drain regions.

13. The semi-conductor of claim 12 wherein the buried channel region has a doping density of between about $10^{16}$ to $10^{18}$ $cm^{-3}$.

14. The semi-conductor of claim 8 wherein the surface channel region has a length which is between about 20% and 50% of the channel length between the source and drain regions.

* * * * *